United States Patent
Seeger

(10) Patent No.: US 12,510,798 B2
(45) Date of Patent: Dec. 30, 2025

(54) GATE APPARATUS

(71) Applicant: Rohde & Schwarz GmbH & Co. KG, Munich (DE)

(72) Inventor: Julius Seeger, Prien am Chiemsee (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 372 days.

(21) Appl. No.: 18/187,134

(22) Filed: Mar. 21, 2023

(65) Prior Publication Data
US 2024/0319562 A1   Sep. 26, 2024

(51) Int. Cl.
G02F 3/00 (2006.01)
G02F 1/21 (2006.01)
H03K 19/21 (2006.01)

(52) U.S. Cl.
CPC ............... *G02F 3/00* (2013.01); *G02F 1/212* (2021.01); *H03K 19/21* (2013.01)

(58) Field of Classification Search
CPC ............ G02F 3/024; G02F 3/00; G02F 1/212; H03K 19/21
USPC .......................................................... 359/108
See application file for complete search history.

(56) References Cited

U.S. PATENT DOCUMENTS

| | | | |
|---|---|---|---|
| 7,787,719 B1 * | 8/2010 | Vawter | H03K 19/14 385/24 |
| 8,014,639 B1 * | 9/2011 | Skogen | G02F 3/00 385/2 |
| 8,363,990 B1 * | 1/2013 | Skogen | G02F 3/00 385/2 |
| 8,582,931 B1 * | 11/2013 | Vawter | G02F 1/3133 385/24 |

* cited by examiner

*Primary Examiner* — Daniel St Cyr
(74) *Attorney, Agent, or Firm* — Westman, Champlin & Koehler, P.A.

(57) ABSTRACT

A gate apparatus configured to perform an XOR operation on received input signals to provide a logical output signal, y. The apparatus includes at least one first signal input adapted to receive a first input signal; and at least one second signal input adapted to receive a second input signal. At least one of the received input signals is split into a first split signal portion fed to a photo diode to generate an electrical photocurrent supplied to a junction node, and a second split signal portion combined with at least a signal portion of the other signal received at the second signal input to generate a combined optical output signal supplied to an electro-optical modulator to provide the logical output signal, y. The electro-optical modulator is driven by a photocurrent processing unit having an input connected to the junction node.

20 Claims, 3 Drawing Sheets

1st Embodiment

2nd Embodiment

3rd Embodiment

4th Embodiment

GATE APPARATUS

FIELD OF THE INVENTION

The present invention relates to a gate apparatus configured to perform an XOR operation on received input signals to provide a logical output signal.

BACKGROUND OF THE INVENTION

Generally, an XOR gate is a logic circuit that gives a true output when a number of true inputs is odd. Accordingly, with an XOR gate receiving two input signals if both input signals comprise different logical values a logical high output value is output. If both input signals comprise the same logical value the output signal of the XOR gate is logically low. Conventional XOR gates combine electrical input signals with an electrical logic circuit. Such a digital logical gate does not allow to perform an XOR operation on received input signals where at least one of the input signals comprises an optical signal. Further, conventional XOR gates comprise limitations concerning the speed of processing received input signals. Accordingly, there is a need to provide a gate apparatus allowing to perform an XOR operation on at least one received optical signal within a short signal processing time.

SUMMARY OF THE INVENTION

The present invention relates to a gate apparatus configured to perform an XOR operation on received input signals to provide a logical output signal,
said gate apparatus comprising
at least one first signal input adapted to receive a first input signal and
at least one second signal input adapted to receive a second input signal,
wherein at least one of the received input signals is split by a splitter adapted to provide a first split signal portion fed to an associated photo diode to generate a corresponding electrical photocurrent supplied to a junction node and adapted to provide a second split signal portion combined by a signal combiner with at least a signal portion of the other signal received at the second signal input to generate a combined optical output signal supplied to a signal input of an electro-optical modulator of the gate apparatus to provide the logical output signal of the gate apparatus,
wherein the electro-optical modulator is driven by a photocurrent processing unit of the gate apparatus having an input connected to the junction node.

In a possible embodiment of the gate apparatus according to the first aspect of the present invention, the first input signal received at the first signal input is amplified by an associated first amplifier of the gate apparatus and wherein the second input signal received at the second signal input is amplified by an associated second amplifier of the gate apparatus.

In a possible embodiment of the gate apparatus according to the first aspect of the present invention, at least one of the amplified signals is split by the splitter adapted to provide the first split signal portion fed to the associated photo diode to generate a corresponding electrical photocurrent supplied to the junction node of the gate apparatus.

In a further possible embodiment of the gate apparatus according to the first aspect of the present invention, both amplified signals output by the first amplifier and output by the second amplifier are split by associated splitters, respectively.

In a further possible embodiment of the gate apparatus according to the first aspect of the present invention, the first amplified signal output by the first amplifier is split by a first splitter to provide a first signal portion fed to an associated first photo diode and a second signal portion is supplied to a first input port of the signal combiner.

In a further possible embodiment of the gate apparatus according to the first aspect of the present invention, a second amplified signal output by the second amplifier is split by a second splitter to provide a first signal portion fed to an associated second photo diode and a second signal portion supplied to a second input port of the signal combiner.

In a further possible embodiment of the gate apparatus according to the first aspect of the present invention, the first photo diode and the second diode are connected antiparallel to the junction node of the gate apparatus.

In a further possible embodiment of the gate apparatus according to the first aspect of the present invention, the first input signal received at the first signal input is split by an associated first splitter of the gate apparatus and the second input signal received at the second signal input is split by an associated second splitter of the gate apparatus.

In a possible embodiment of the gate apparatus according to the first aspect of the present invention, the first input signal received at the first signal input is split by the first splitter to provide a first signal portion amplified by an associated first amplifier to provide an amplified signal fed to an associated first photo diode and a second signal portion supplied to a first input port of the signal combiner and
wherein a second input signal received at the second signal input is split by the second splitter to provide a first signal portion amplified by an associated second amplifier to provide an amplified signal fed to an associated second photo diode and a second signal portion supplied to a second input port of the signal combiner,
wherein the first photo diode and the second diode are connected antiparallel to the junction node of the gate apparatus.

In a further possible embodiment of the gate apparatus according to the first aspect of the present invention, the electro-optical modulator comprises a Mach Zehnder modulator having a modulation input connected to an output of the photocurrent processing unit.

In a still further possible embodiment of the gate apparatus according to the first aspect of the present invention, the Mach Zehnder modulator is configured to switch off the logical output signal if the first input signal received at the first signal input of the gate apparatus and the second input signal received at the second signal input of the gate apparatus comprise logical high signal values.

In a still further possible embodiment of the gate apparatus according to the first aspect of the present invention, the signal combiner comprises a signal coupler having at least two input ports and an output port, wherein the output port of the signal combiner is connected via a signal delay line to a signal input of the electro-optical modulator.

In a further possible embodiment of the gate apparatus according to the first aspect of the present invention, the electro-optical modulator is adapted to modulate a signal delayed by the delay line and received at the signal input of the electro-optical modulator in response to a modulation signal received at a modulation input of the electro-optical modulator to provide a modulated output signal at a signal output of the electro-optical modulator.

In a further possible embodiment of the gate apparatus according to the first aspect of the present invention, the signal output of the electro-optical modulator is connected to an amplifier input of a third amplifier adapted to amplify the modulated output signal output by the electro-optical modulator to generate the logical output signal of the gate apparatus.

In a still further possible embodiment of the gate apparatus according to the first aspect of the present invention, the first signal input of the gate apparatus is an optical signal input adapted to receive a first optical input signal and the second signal input of the gate apparatus is an optical signal input adapted to receive a second optical input signal.

In a further possible embodiment of the gate apparatus according to the first aspect of the present invention, the first signal input of the gate apparatus is an optical signal input adapted to receive an optical input signal and the second signal input of the gate apparatus is an electrical signal input adapted to receive an electrical input signal.

In a still further possible embodiment of the gate apparatus according to the first aspect of the present invention, the electrical input signal received at the electrical signal input of the gate apparatus is supplied to a diode adapted to generate an optical signal.

In a further possible embodiment of the gate apparatus according to the first aspect of the present invention, the optical signal generated by the diode is amplified by an associated optical signal amplifier.

In a further possible embodiment of the gate apparatus according to the first aspect of the present invention, the electrical signal received at the electrical signal input of the gate apparatus is further supplied to an electrical signal processing unit adapted to provide an amplified electrical signal fed to the junction node of the gate apparatus.

In a still further possible embodiment of the gate apparatus according to the first aspect of the present invention, the first input signal received at the first signal input is amplified by an associated first optical amplifier of the gate apparatus and the second input signal received at the second signal input is amplified by an associated second optical amplifier of the gate apparatus.

In a further possible embodiment of the gate apparatus according to the first aspect of the present invention, the third amplifier is an optical amplifier adapted to amplify the modulated optical output signal output by the electro-optical modulator to generate a logical optical output signal of the gate apparatus.

In a still further possible embodiment of the gate apparatus according to the first aspect of the present invention, the logical optical output signal provided by the third optical amplifier is fed to a photo diode adapted to provide a corresponding logical electrical output signal of the gate apparatus.

In a further possible embodiment of the gate apparatus according to the first aspect of the present invention, the splitter adapted to provide a first split signal portion fed to an associated photo diode and adapted to provide a second split signal portion fed to the signal combiner comprises an optical splitter.

In a further possible embodiment of the gate apparatus according to the first aspect of the present invention, the first optical amplifier and the second optical amplifier both comprise a signal amplification stage, an optical diode adapted to suppress back reflections into the signal amplification stage and a limiter.

The invention provides according to a further aspect a gate apparatus configured to perform an XOR operation on received input signals to provide a logical output signal, said gate apparatus comprising:
at least one first signal input adapted to receive a first input signal, amplified by a first amplifier and
at least one second signal input adapted to receive a second input signal amplified by a second amplifier,
wherein both received input signals or both amplified signals output by the amplifiers are split by associated splitters respectively, to provide
a first signal portion fed to an associated photo diode to generate a corresponding electrical photocurrent supplied to a junction node of the gate apparatus and
a second signal portion supplied to an associated input port of a signal combiner adapted to generate a combined output signal supplied to a signal input of an electro-optical modulator of the gate apparatus to provide the logical output signal of the gate apparatus,
wherein the photo diodes are connected antiparallel to the junction node of the gate apparatus, and
wherein the electro-optical modulator is driven by a photocurrent processing unit of the gate apparatus having an input connected to the junction node of the gate apparatus.

The invention provides according to a further aspect a gate apparatus configured to perform an XOR operation on received input signals to provide a logical output signal, said gate apparatus comprising
at least one first signal input adapted to receive an optical input signal amplified by an associated first optical amplifier and
at least one second signal input adapted to receive an electrical input signal supplied to a diode adapted to generate an optical signal amplified by an associated second optical signal amplifier, wherein the optical input signal received at the first signal input of the gate apparatus is split by a splitter adapted to provide a first split signal portion fed to an associated photo diode to generate a corresponding electrical photocurrent supplied to a junction node of the gate apparatus and adapted to provide a second split signal portion combined by a signal combiner with the amplified optical signal provided by the second optical amplifier to generate a combined optical output signal supplied to a signal input of an electro-optical modulator of the gate apparatus to provide the logical output signal of the gate apparatus and
wherein the electrical signal received at the second signal input of the gate apparatus is further supplied to an electrical signal processing unit adapted to provide an amplified electrical current fed to the junction node of the gate apparatus,
wherein the electrical photocurrent provided by the photo diode and the electrical current provided by the electrical signal processing unit are added at the junction node, and
wherein the electro-optical modulator is driven by a photocurrent processing unit of the gate apparatus having an input connected to the junction node of the gate apparatus.

The invention provides according to a further aspect a pseudo random binary sequence generation apparatus comprising
at least one gate apparatus configured to perform an XOR operation on received input signals to provide a logical output signal, said gate apparatus having:

at least one first signal input adapted to receive a first input signal and at least one second signal input adapted to receive a second input signal, wherein at least one of the received input signals is split by a splitter adapted to provide a first split signal portion fed to an associated photo diode to generate a corresponding electrical photocurrent supplied to a junction node and adapted to provide a second split signal portion combined by a signal combiner with at least a signal portion of the other signal received at the second signal input to generate a combined optical output signal supplied to a signal input of an electro-optical modulator of the gate apparatus to provide the logical output signal of the gate apparatus, wherein the electro-optical modulator is driven by a photocurrent processing unit of the gate apparatus having an input connected to the junction node.

Additional advantages and novel features of the present invention will become apparent to those skilled in the art upon examination of the followed detailed description thereof when considered in conjunction with the accompanying drawings.

BRIEF DESCRIPTION OF THE DRAWINGS

The accompanying drawings, which are incorporated herewith form part of the specification, illustrate several aspects of the present invention and, together with the description, serve to explain the principles of the present invention. The drawings are only for the purpose of illustrating preferred embodiments of the present invention and are not to be construed as limiting the invention.

DETAILED DESCRIPTION OF THE INVENTION

Figure 1:
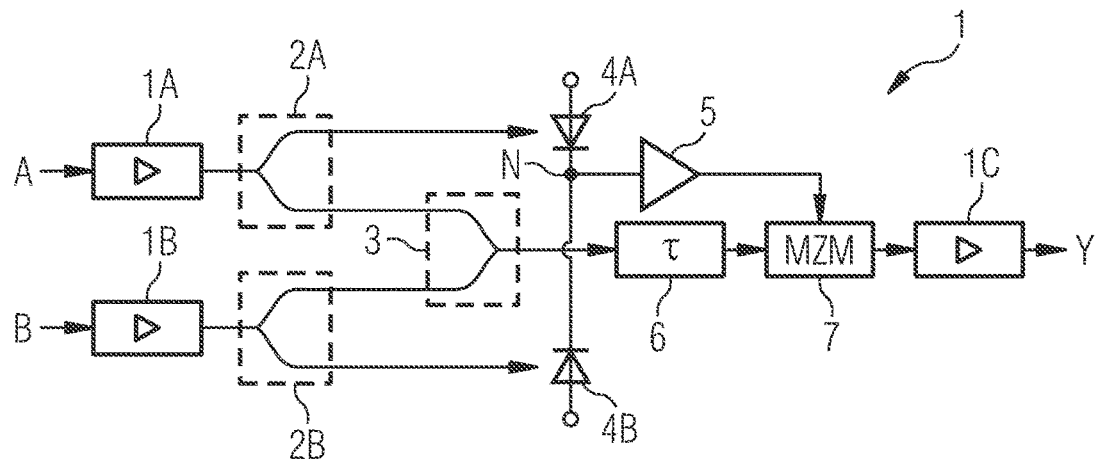
FIG. 1 shows a first exemplary embodiment of a gate apparatus according to the present invention.

Referring to FIG. 1, there is a schematic circuit diagram for illustrating a possible exemplary embodiment of a gate apparatus 1 according to the present invention. The illustrated gate apparatus 1 is adapted to perform an XOR logical operation on received input signals to provide a logical output signal y. As can be seen in the circuit diagram of FIG. 1, the gate apparatus 1 comprises at least one first signal input A adapted to receive a first input signal and at least one second signal input B adapted to receive a second input signal. The gate apparatus 1 further comprises a signal output to provide the logical output signal y. In the embodiment illustrated in FIG. 1, the first input signal received at the first signal input A is amplified by an associated first amplifier 1A of the gate apparatus 1. Further, the second input signal received at the second signal input B is amplified by an associated second amplifier 1B of the gate apparatus 1. At least one of the amplified signals is split by a splitter 2. In the embodiment illustrated in FIG. 1, both amplified signals are split by an associated splitter 2A, 2B, respectively. The first amplified signal output by the first amplifier 1A is split by a first splitter 2A and the second amplified signal output by the second amplifier 1B is split by a second splitter 2B as shown in FIG. 1. The first splitter 2A provides a first signal portion fed to an associated first photo diode 4A and a second signal portion supplied to a first input port of a signal combiner 3. The second splitter 2B provides a first signal portion fed to an associated second photo diode 4B and a second signal portion supplied to a second input port of the signal combiner 3. The signal combiner 3 is adapted to generate a combined optical output signal supplied directly or in a preferred embodiment via a delay signal line 6 to a signal input of an electro-optical modulator 7. The signal combiner 3 can comprise a signal coupler having at least two input ports and an output port as shown in FIG. 1. The first input port of the signal combiner 3 receives a signal portion from the first splitter 2A. The second input port of the signal combiner 3 receives a signal portion from the second splitter 2B. The received signal portions are combined to provide an optical output signal supplied via the signal delay line 6 to a signal input of the electro-optical modulator 7 as shown in FIG. 1.

The amplified input signals output by the amplifiers 1A, 1B are split by the associated splitters 2A, 2B to provide a first signal portion fed to an associated photo diode 4A, 4B to generate a corresponding electrical photocurrent Iph supplied to a junction node N of the gate apparatus 1 and to provide a second signal portion supplied to an associated input port of the signal combiner 3 which generates a combined optical output signal supplied to a signal input of the electro-optical modulator 7 via the delay signal line 6. As can be seen in the block diagram of FIG. 1, photo diodes 4A, 4B are connected antiparallel to the junction node N of the gate apparatus 1. Accordingly, the generated photocurrents provided by the photo diodes 4A, 4B are added at the junction node N of the gate apparatus 1. The photocurrent processing unit 5 shown in FIG. 1 is connected to the junction node N and is adapted to drive the electro-optical modulator 7 of the gate apparatus 1. The input of the photocurrent processing unit 5 is connected to the junction node N and the output of the photocurrent processing unit 5 is connected to a modulation control input of the electro-optical modulator 7.

The electro-optical modulator 7 is adapted to modulate an optical signal delayed by the delay line 6 and received at a signal input of the electro-optical modulator 7 in response to a modulation control signal received at the modulation control input of the electro-optical modulator 7 to provide a modulated output signal at a signal output of the electro-optical modulator 7. In the embodiment illustrated in FIG. 1, the signal output of the electro-optical modulator 7 is connected to an amplifier input of a third amplifier 1C adapted to amplify the modulated output signal output by the electro-optical modulator 7 to generate the logical output signal y of the gate apparatus 1. In the first embodiment illustrated in FIG. 1, the logical output signal y output by the third amplifier 1C comprises an optical logical output signal. In a possible implementation, the photocurrent processing unit 5 having an input connected to the junction node N comprises a transimpedance amplifier. The transimpedance amplifier is adapted to amplify the electrical photocurrents generated by the photo diodes 4A, 4B summed up at the junction node N to generate a modulation signal for the electro-optical modulator 7.

In a preferred embodiment of the gate apparatus 1 according to the present invention, the electro-optical modulator 7 comprises a Mach-Zehnder modulator having a modulation input connected to the output of the photocurrent processing unit 5. The Mach Zehnder modulator 7 is configured to switch off the logical output signal y if the first input signal received at the first signal input A of the gate apparatus 1 and the second input signal received at the second signal input B of the gate apparatus 1 both comprise logical high signal values. The summed up photocurrents of the two photo diodes 4A, 4B equal in a preferred embodiment a half-wave voltage of the transfer function of the Mach Zehnder modulator 7. This half-wave voltage is a voltage within the transfer function of the Mach Zehnder modulator 7 where no signal transmission of an optical signal through the Mach Zehnder modulator 7 is performed.

A shift in the phase $\phi$ of a light wave with a wavelength $\lambda$ can be achieved in response to a refractive index change due to a linear electro-optic effect. The phase shift and is governed by the relation:

$$\phi = (nL)(2\pi/\lambda)$$

wherein
L is length of a medium and
n is a refractive index.

As the refractive index n increases due to the applied voltage V, the wavelength $\lambda$ of the light wave does decrease. For a bias voltage of 2V $\pi$, an additional wave (i.e. a phase delay of $2\pi$) will be provided within the waveguide for the same length L. Hence the quantity V$\pi$ adds one half of the wave in the waveguide and hence is termed as the half wave voltage. The phase (in radians) introduced in the waveguide is related to the applied voltage V given by:

$$\text{Delta } \phi = (V(t))(\pi/V\pi)$$

Intensity or amplitude modulation can also be achieved through this phase modulation by using an interferometric structure. Here two signal propagation arms can be connected by two anti-parallel Y junction couplers wherein one of the two signal propagation arms comprises an electro-optic material and is built such that it induces a phase change of n in the optical signal when it reaches the 2nd junction when a bias voltage of V$\pi$ volts is applied. When applying the bias voltage of V$\pi$ the out of phase optical signals cancel each other at the 2nd junction leaving a zero output signal power Pout. When the bias electrode is unbiased, there is no electro-optic effect, so that both optical signal waves are in phase and add up at the 2nd junction providing a maximum signal power (Pout) max. Such a modulator is called Mach-Zehnder intensity electro-optic modulator or simply Mach-Zehnder modulator (MZM). The voltage V$\pi$ is the voltage required to switch the MZM from high optical intensity (maximum transmission) to no intensity (minimum transmission) or vice versa, hence also called the switching voltage.

If the first input signal received at the first signal input A and the second input signal received at the second signal input B of the gate apparatus 1 both comprise a high logical signal value, the photo diodes 4A, 4B generate the same photocurrents IphA, IphB (IphA=IphB) summed up at the junction node N and amplified by a transimpedance amplifier of the photocurrent processing unit 5 to generate a modulation control signal supplied to the modulation control input of the electro-optical modulator 7, in particular to the modulation control input of the Mach Zehnder modulator 7. The photocurrents IphA, IphB provided by the diodes 4A, 4B are summed at the junction node N to generate a sum photocurrent (Iph–total=IphA+IphB) transformed by the transimpedance amplifier of the photocurrent processing unit 5 into a control voltage. The transimpedance amplifier comprises a current to voltage converter. The electro-optical modulator 7 comprises a voltage transfer function where the optical output signal is cut off at a specific applied control voltage referred to as a half wave voltage. The Mach Zehnder modulator 7 is configured to switch the optical output signal off if the electrical photocurrents IphA, IphB generated by the photo diodes 4A, 4B at the common junction node N are equal. Accordingly, in case that the first input signal received at the first signal input A and the second input signal received at the second signal input B are equal, the logical output signal y output by the Mach Zehnder modulator 7 is zero. In case that either the first input signal at the first signal input A or the second input signal at the second signal input B is logic high, the half-wave voltage is not reached and the Mach Zehnder modulator 7 transmits the received optical signal. In case that no logical high signal is present at any of the two signal inputs A, B this does result in that no output signal is provided, i.e. an output signal with a logical low value. Accordingly, only a mismatch of the amplitudes of the photocurrents IphA, IphB provided by the photo diodes 4A, 4B lead to an optical signal output by the electro-optical modulator 7 having a logical high signal value.

Figure 2:
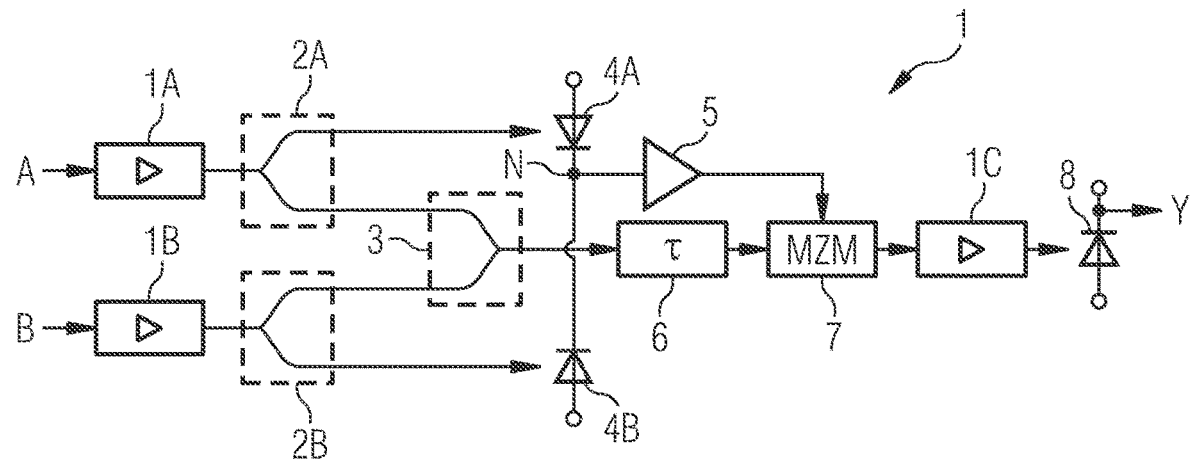
FIG. 2 shows a further exemplary embodiment of a gate apparatus according to the present invention.

FIG. 2 shows a further second embodiment of the gate apparatus 1 according to the present invention. The gate apparatus 1 of FIG. 2 comprises the same components as the embodiment of FIG. 1 with an additional photo diode 8 provided at the output of the third optical amplifier 1C. The logical optical output signal of the electro-optical modulator 7 is amplified by the third optical amplifier 1C to provide an amplified optical logical output signal. The amplified optical output signal is fed to the photo diode 8 to generate a corresponding logical electrical output signal of the gate apparatus 1. Accordingly, whereas the embodiment illustrated in FIG. 1 provides an optical logical output signal, the gate apparatus 1 illustrated in FIG. 2 generates an electrical logical output signal. Instead of placing an optical amplifier such as the optical amplifier 1C in front of the diode 8, also an electrical amplifier can be used placed behind the diode 8.

Figure 3:
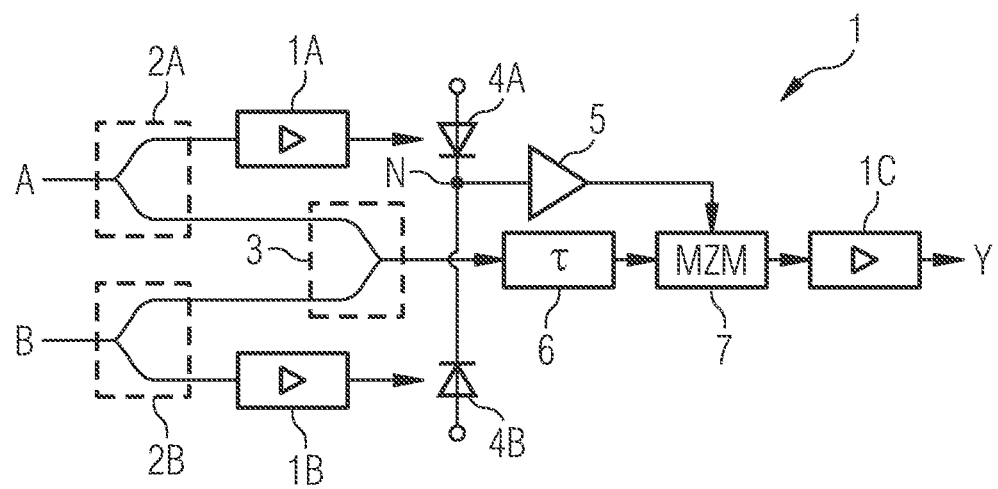
FIG. 3 illustrates a further exemplary embodiment of a gate apparatus according to the present invention.

FIG. 3 illustrates a further third embodiment of the gate apparatus 1 according to the present invention. The gate apparatus 1 shown in FIG. 3 is similar to the gate apparatus 1 illustrated in FIG. 1, however, the received signals are split before they are amplified. Accordingly, in the embodiment shown in FIG. 3, the first input signal received at the first signal input A is split by an associated first splitter 2A of the gate apparatus 1 and the second input signal received at the second signal input B is split by an associated second splitter 2B of the gate apparatus 1.

The first input signal received at the first signal input A is split by the first splitter 2A to provide a first signal portion amplified by an associated first amplifier 1A to provide an amplified signal fed to an associated first photo diode 4A and a signal portion supplied to a first input port of the signal combiner 3. The second input signal received at the second signal input B is split by the second splitter 2B to provide a first signal portion amplified by an associated second amplifier 1B to provide an amplified signal fed to an associated second photo diode 4B and a second signal portion supplied to a second input port of the signal combiner 3. The signal combiner 3 comprises the first input port to receive a signal portion from the first splitter 2A and a second input port adapted to receive a signal portion from the second splitter 2B as illustrated in FIG. 3. The signal combiner comprises an output port to supply the combined optical signal via the signal delay line 6 to the signal input of the electro-optical modulator 7. Similar to the embodiments of FIGS. 1, 2, the first photo diode 4A and the second diode 4B are connected antiparallel to the junction node N of the gate apparatus 1. The electro-optical modulator 7 illustrated in the third embodiment can also be formed by a Mach Zehnder modulator 7 having a modulation input connected to an output of a photocurrent processing unit 5 which may comprise in a preferred embodiment a transimpedance amplifier receiving the summed up photocurrent from the junction node N.

Figure 4:
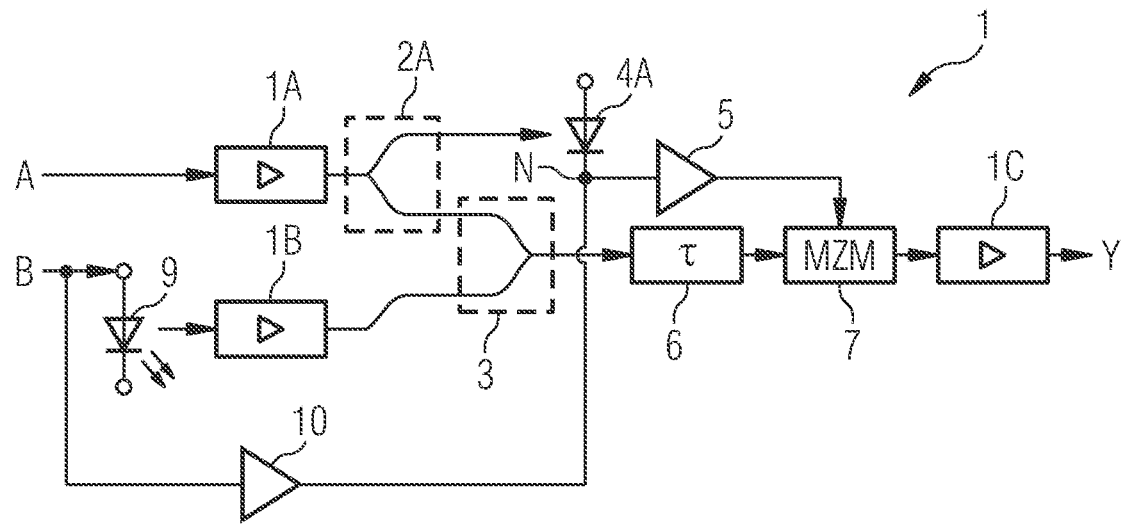
FIG. 4 illustrates a further exemplary embodiment of a gate apparatus according to the present invention.

FIG. 4 shows a further fourth embodiment of the gate apparatus 1 according to the present invention. In the illustrated embodiment of FIG. 4, the first signal input A of the gate apparatus 1 receives an optical signal and the second signal input B of the gate apparatus 1 receives an electrical input signal. The electrical input signal received at the electrical signal input B of the gate apparatus 1 is supplied in the illustrated embodiment of FIG. 4 to a diode 9 adapted to generate an optical signal. The diode 9 may comprise a laser diode. The optical signal generated by the diode 9 is amplified by an associated optical signal amplifier 1B as shown in FIG. 4. The electrical signal received at the electrical signal input B of the gate apparatus shown in FIG. 4 is further supplied to an electrical signal processing unit 10 adapted to provide an amplified electrical signal fed to the junction node N of the gate apparatus. The amplified electrical signal provided by the electrical signal processing unit 10 and the photocurrent provided the diode 4A are summed up at the junction node N to provide a summed up electrical current supplied to the input of the photocurrent processing unit 5 of the gate apparatus having an input connected to the junction node N. If the current provided by the electrical signal processing unit 10 equals the photocurrent provided by the diode 4A, the photoelectric modulator 7 cuts off the received optical signal to provide a logical output signal y with a low optical value. In the embodiment illustrated in FIG. 4, the optical output signal of the photoelectrical modulator 7 is amplified by a third optical amplifier 1C to provide an optical logical output signal y.

Figure 5:
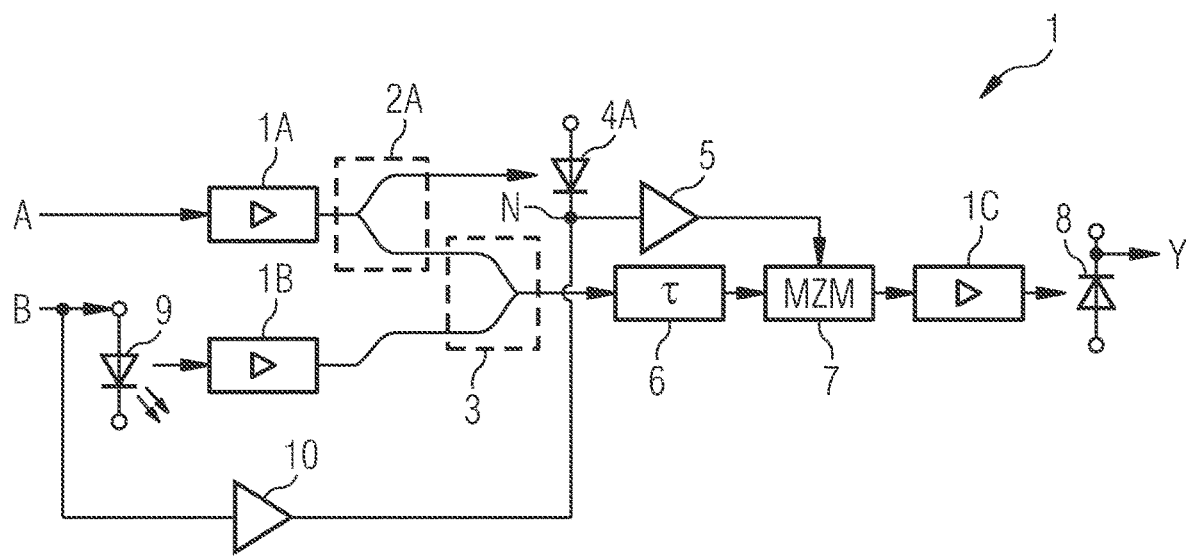
FIG. 5 illustrates a further exemplary embodiment of a gate apparatus according to the present invention.

In a fifth embodiment illustrated in FIG. 5, the amplified optical output signal provided by the third optical amplifier 1C is transformed by the photo diode 8 into an electrical logical output signal y. The gate apparatus 1 according to the fourth embodiment illustrated in FIG. 4 and the gate apparatus 1 according to the fifth embodiment illustrated in FIG. 5 require a single optical splitter 2A whereas the gate apparatus according to the first to third embodiment illustrated in FIGS. 1, 2, 3 comprises two optical splitters 2A, 2B. The gate apparatus 1 of FIG. 4 or FIG. 5 comprises a diode 9 to transform the electrical input signal at the second signal input B to an optical signal amplified by the amplifier 1B. The same electrical signal is also supplied to the electrical signal processing unit 10 to generate an amplified electrical current fed to the junction node N of the gate apparatus.

The different embodiments illustrated in FIGS. 1 to 5 comprise an optical signal combiner 3 adapted to combine optical signals. The signal combiner 3 can comprise a signal coupler having at least two input ports and an output port. The output port of the optical signal combiner 3 is connected via the signal delay line 6 to the signal input of the electro-optical modulator 7. The signal delay line 6 may comprise a predefined physical length to obtain a required transmission delay of the optical signal. In an alternative embodiment, the travelling speed of the transported light is reduced, e.g. by strain. The optical delay line 6 is provided to compensate the delay on the electronic line.

The different embodiments of the gate apparatus as illustrated in FIGS. 1 to 5, each comprise at least one optical splitter. The first to third embodiment comprise two optical splitters 2A, 2B. The embodiments illustrated in FIGS. 4, 5 comprise a single optical splitter 2A. The optical splitter 2A is adapted to split a received optical signal into a first signal portion and into a second split signal portion. In a preferred embodiment, the optical splitter is adapted to split a received optical signal into a first signal portion and into a second signal portion of equal signal strength.

Figure 6:
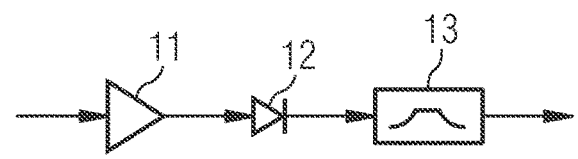
FIG. 6 illustrates an exemplary implementation of an optical amplifier used in a gate apparatus according to the present invention to amplify an optical signal.

The gate apparatus comprises optical amplifiers 1A, 1B, 1C. FIG. 6 illustrates a possible implementation of an optical amplifier used in the gate apparatus according to the present invention. The optical amplifiers 1A, 1B, 1C each comprise a signal amplification stage 11, an optical diode 12 and a limiter 13. The optical diode 12 is adapted to suppress back reflections into the signal amplification stage 11. The optical signal amplification stage 11 may comprise an SOA (Semiconductor Optical Amplifier), an EDFA (Erbium-Doped Fiber Amplifier) or a PDFA (Praseodymium-Doped Fiber Amplifier) for optical signal amplification. The optical diode 12 is adapted to suppress back reflections into the respective signal amplification stage and can be realized in a possible implementation by a Faraday rotator. The limiter 13 can be realized by non-linear materials and enabling SBS (Stimulated Brillouin Scattering). The optical amplifier is provided to generate a stable output power. The limiter 13 can in a possible implementation also form part of the amplification stage 11.

In a possible embodiment, the gate apparatus 1 forms part of a pseudo random binary sequence (PRBS) generation apparatus. The pseudo random binary sequence generation apparatus is adapted to generate a pseudo random binary sequence signal which can be used for phase signal generation.

The gate apparatus can be embedded to perform a logical XOR operation on two optical input signals or on an optical signal and an electrical signal to provide a logical output signal y. The output logical signal y can be an optical signal as illustrated in FIGS. 1, 3, 4 or an electrical signal as illustrated in the embodiments of FIGS. 2, 5.

The at least one optical signal to be processed by the gate apparatus 1 is generated by an optical signal source. The optical signal source generates an amplitude modulated (AM) optical signal supplied to the at least one optical signal input A of the gate apparatus 1. The optical signal comprises an optical carrier adapted to carry an encoded signal information. The frequency of the encoded signal may exceed 100 GHz. The gate apparatus 1 according to the present invention allows a faster signal processing than conventional electrical XOR gates comprising parasitic capacitance limiting the switching frequency. The gate apparatus 1 according to the present invention can perform a logical XOR operation on received signals without requiring knowledge of the relative phase between the carrier signals of the received optical signals. Accordingly, the processing of the received signals can be performed without depending on a signal phase of the optical carriers.

The gate apparatus according to the present invention as illustrated in the embodiments of FIGS. 1 to 5 can be combined with each other to provide optoelectronic logic circuits for performing different logical operations on received signals.

The gate apparatus 1 allows in a possible embodiment to process input optical signals. The gate apparatus 1 can also process in an alternative embodiment input optical signals and input electrical signals, i.e. hybrid signals.

In a still further embodiment the gate apparatus 1 can switch a signal input such as the second input B between optical input (optical operation mode) and electrical input (hybrid operation mode) in response to an operation mode selection signal. In the optical operation mode an XOR operation is performed on two optical signals received at signal inputs A, B while in the hybrid operation mode an XOR operation is performed on an optical signal received at signal input A and on an electrical signal received at signal input B.

The matter set forth in the foregoing description and accompanying drawings is offered by way of illustration only and not as a limitation.

The invention claimed is:

1. A gate apparatus configured to perform an XOR operation on received input signals to provide a logical output signal, y,
   said gate apparatus comprising:
   at least one first signal input adapted to receive a first input signal; and
   at least one second signal input adapted to receive a second input signal;
   wherein at least one of the received input signals is split by a splitter adapted to provide a first split signal portion fed to an associated photo diode to generate a corresponding electrical photocurrent supplied to a junction node and adapted
   to provide a second split signal portion combined by a signal combiner with at least a signal portion of the other signal received at the second signal input to generate a combined optical output signal supplied to a signal input of an electro-optical modulator of the gate apparatus to provide the logical output signal, y, of the gate apparatus,
   wherein the electro-optical modulator is driven by a photocurrent processing unit of the gate apparatus having an input connected to the junction node,
   wherein the photocurrent processing unit comprises a trans-impedance amplifier adapted to amplify electrical currents summed up at the junction node to generate a modulation signal for the electro-optical modulator,
   wherein electrical currents summed up at the junction node comprise electrical photocurrents generated by photo diodes connected antiparallel to the junction node of the gate apparatus or
   wherein the electric currents summed up at the junction node comprise an electrical current generated by a photodiode and an electrical current generated by an electrical signal processing unit having an input connected to the second signal input,
   wherein if there is a mismatch of the amplitudes of the electrical currents summed up at the junction node this leads to an optical signal output by the electro-optical modulator having a logical high value and
   wherein if the electrical currents summed up at the junction node are equal the electro-optical modulator cuts off the received optical signal to provide an optical output signal having a logical low value.

2. The gate apparatus according to claim 1,
   wherein the first input signal received at the first signal input is amplified by an associated first amplifier of the gate apparatus and
   wherein the second input signal received at the second signal input is amplified by an associated second amplifier of the gate apparatus.

3. The gate apparatus according to claim 2,
   wherein at least one of the amplified signals is split by the splitter adapted to provide the first split signal portion fed to the associated photo diode to generate a corresponding electrical photocurrent supplied to the junction node of the gate apparatus.

4. The gate apparatus according to claim 2,
   wherein both amplified signals output by the first amplifier and output by the second amplifier are split by associated splitters respectively, wherein the first amplified signal output by the first amplifier is split by a first splitter to provide a first signal portion fed to an associated first photo diode and a second signal portion supplied to a first input port of the signal combiner, and
   wherein a second amplified signal output by the second amplifier is split by a second splitter to provide a first signal portion fed to an associated second photo diode and a second signal portion supplied to a second input port of the signal combiner,
   wherein the first photo diode and the second diode are connected antiparallel to the junction node of the gate apparatus.

5. The gate apparatus according to claim 1,
   wherein the first input signal received at the first signal input is split by an associated first splitter of the gate apparatus and
   wherein the second input signal received at the second signal input is split by an associated second splitter of the gate apparatus,
   wherein a first input signal received at the first signal input is split by the first splitter to provide a first signal portion amplified by an associated first amplifier to provide an amplified signal fed to an associated first photo diode and a second signal portion supplied to a first input port of the signal combiner, and
   wherein a second input signal received at the second signal input is split by the second splitter to provide a first signal portion amplified by an associated second amplifier to provide an amplified signal fed to an associated second photo diode and a second signal portion supplied to a second input port of the signal combiner, and
   wherein the first photo diode and the second diode are connected antiparallel to the junction node of the gate apparatus.

6. The gate apparatus according to claim 1,
   wherein the electro-optical modulator comprises a Mach Zehnder modulator having a modulation input connected to an output of the photocurrent processing unit.

7. The gate apparatus according to claim 6,
   wherein the Mach Zehnder Modulator is configured to switch off the logical output signal, y, if the first input signal received at the first signal input of the gate apparatus and the second input signal received at the second signal input- of the gate apparatus comprise logical high signal values.

8. The gate apparatus according to claim 1,
   wherein the signal combiner comprises a signal coupler having at least two input ports and an output port, wherein the output port of the signal combiner is connected via a signal delay line to a signal input of the electro-optical modulator.

9. The gate apparatus according to claim 8,
wherein the electro-optical modulator is adapted to modulate a signal delayed by the delay line and received at the signal input of the electro-optical modulator in response to a modulation signal received at a modulation input of the electro-optical modulator to provide a modulated output signal at a signal output of the electro-optical modulator.

10. The gate apparatus according to claim 9,
wherein the signal output of the electro-optical modulator is connected to an amplifier input of a third amplifier adapted to amplify the modulated output signal output by the electro-optical modulator to generate the logical output signal, y, of the gate apparatus.

11. The gate apparatus according to claim 10,
wherein the third amplifier is an optical amplifier adapted to amplify the modulated optical output signal output by the electro-optical modulator to generate a logical optical output signal, y, of the gate apparatus, wherein the logical optical output signal, y, provided by the third optical amplifier is fed to a photo diode adapted to provide a corresponding logical electrical output signal of the gate apparatus.

12. The gate apparatus according to claim 1,
wherein the first signal input of the gate apparatus is an optical signal input adapted to receive a first optical input signal and
wherein the second signal input of the gate apparatus is an optical signal input adapted to receive a second optical input signal.

13. The gate apparatus according to claim 12,
wherein the first input signal received at the first signal input is amplified by an associated first optical amplifier of the gate apparatus and
wherein the second input signal received at the second signal input is amplified by an associated second optical amplifier of the gate apparatus.

14. The gate apparatus according to claim 13,
wherein the first optical amplifier and the second optical amplifier both comprise a signal amplification stage, an optical diode adapted to suppress back reflections into the signal amplification stage and a limiter.

15. The gate apparatus according to claim 1,
wherein the first signal input of the gate apparatus is an optical signal input adapted to receive an optical input signal and
wherein the second signal input of the gate apparatus is an electrical signal input adapted to receive an electrical input signal.

16. The gate apparatus according to claim 15,
wherein the electrical input signal received at the electrical signal input of the gate apparatus is supplied to a diode adapted to generate an optical signal.

17. The gate apparatus according to claim 16,
wherein the optical signal generated by the diode is amplified by an associated optical signal amplifier.

18. The gate apparatus according to claim 15,
wherein the electrical signal received at the electrical signal input of the gate apparatus is further supplied to an electrical signal processing unit adapted to provide an amplified electrical signal fed to the junction node of the gate apparatus.

19. The gate apparatus according to claim 1,
wherein the splitter adapted to provide a first split signal portion fed to an associated photo diode and adapted to provide a second split signal portion fed to the signal combiner comprises an optical splitter.

20. A pseudo random binary sequence (PRBS) generation apparatus comprising
at least one gate apparatus configured to perform an XOR operation on received input signals to provide a logical output signal, y,
said gate apparatus comprising:
at least one first signal input adapted to receive a first input signal; and
at least one second signal input adapted to receive a second input signal;
wherein at least one of the received input signals is split by a splitter adapted to provide a first split signal portion fed to an associated photo diode to generate a corresponding electrical photocurrent supplied to a junction node and adapted
to provide a second split signal portion combined by a signal combiner with at least a signal portion of the other signal received at the second signal input to generate a combined optical output signal supplied to a signal input of an electro-optical modulator of the gate apparatus to provide the logical output signal, y, of the gate apparatus,
wherein the electro-optical modulator is driven by a photocurrent processing unit of the gate apparatus having an input connected to the junction node,
wherein the photocurrent processing unit comprises a trans-impedance amplifier adapted to amplify electrical currents summed up at the junction node to generate a modulation signal for the electro-optical modulator,
wherein electrical currents summed up at the junction node comprise electrical photocurrents generated by photo diodes connected antiparallel to the junction node of the gate apparatus or
wherein the electric currents summed up at the junction node comprise an electrical current generated by a photodiode and an electrical current generated by an electrical signal processing unit having an input connected to the second signal input,
wherein if there is a mismatch of the amplitudes of the electrical currents summed up at the junction node this leads to an optical signal output by the electro-optical modulator having a logical high value and
wherein if the electrical currents summed up at the junction node are equal the electro-optical modulator cuts off the received optical signal to provide an optical output signal having a logical low value.

* * * * *